United States Patent
Miyagi et al.

(10) Patent No.: US 9,997,542 B2
(45) Date of Patent: Jun. 12, 2018

(54) DISPLAY DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Noriko Miyagi, Shiga (JP); Masayuki Sakakura, Kanagawa (JP); Tatsuya Arao, Kanagawa (JP); Ritsuko Nagao, Kanagawa (JP); Yoshifumi Tanada, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 15/042,950

(22) Filed: Feb. 12, 2016

(65) Prior Publication Data

US 2016/0247826 A1  Aug. 25, 2016

Related U.S. Application Data

(63) Continuation of application No. 14/306,309, filed on Jun. 17, 2014, now Pat. No. 9,261,722, which is a (Continued)

(30) Foreign Application Priority Data

Jun. 16, 2003 (JP) ................................. 2003-171431

(51) Int. Cl.
  *H01L 27/12* (2006.01)
  *H01L 27/14* (2006.01)
  (Continued)

(52) U.S. Cl.
  CPC ...... *H01L 27/124* (2013.01); *G02F 1/133345* (2013.01); *G09G 3/3233* (2013.01);
  (Continued)

(58) Field of Classification Search
  CPC ............. H01L 51/5203; H01L 51/5262; H01L 2251/5315; H01L 27/3244; H01L 27/3258
  See application file for complete search history.

(56) References Cited

U.S. PATENT DOCUMENTS 4,786,358 A  11/1988 Yamazaki et al.
5,163,220 A  11/1992 Zeto et al.
(Continued)

FOREIGN PATENT DOCUMENTS

EP         1045451 A    10/2000
JP      07-130652 A     5/1995
(Continued)

OTHER PUBLICATIONS

Baldo.M et al., "Highly Efficient Phosphorescent Emission From Organic Electroluminscent Devices", Nature, Sep. 10, 1998, vol. 395, pp. 151-154.

(Continued)

*Primary Examiner* — Cuong Q Nguyen
(74) *Attorney, Agent, or Firm* — Fish & Richardson P.C.

(57) ABSTRACT

An object of the present invention is to decrease substantial resistance of an electrode such as a transparent electrode or a wiring, and furthermore, to provide a display device for which is possible to apply same voltage to light-emitting elements. In the invention, a auxiliary wiring that is formed in one layer in which a conductive film of a semiconductor element such as an electrode, wiring, a signal line, a scanning line, or a power supply line is connected to an electrode typified by a second electrode, and a wiring. It is preferable that the auxiliary wiring is formed into a conductive film to include low resistive material, especially, formed to include lower resistive material than the resistance of an electrode and a wiring that is required to reduce the resistance.

24 Claims, 13 Drawing Sheets

Related U.S. Application Data continuation of application No. 13/104,074, filed on May 10, 2011, now Pat. No. 8,759,835, which is a continuation of application No. 11/620,120, filed on Jan. 5, 2007, now Pat. No. 7,943,938, which is a continuation of application No. 10/867,226, filed on Jun. 15, 2004, now Pat. No. 7,161,184.

(51) Int. Cl.
| | | |
|---|---|---|
| *G09G 3/3233* | (2016.01) | |
| *H01L 27/32* | (2006.01) | |
| *H01L 51/52* | (2006.01) | |
| *G02F 1/1333* | (2006.01) | |
| *H01L 23/522* | (2006.01) | |
| *H01L 33/40* | (2010.01) | |

(52) U.S. Cl.
CPC ...... *H01L 27/1222* (2013.01); *H01L 27/1248* (2013.01); *H01L 27/3276* (2013.01); *H01L 51/5206* (2013.01); *H01L 51/5221* (2013.01); *H01L 51/5228* (2013.01); *G09G 2300/0842* (2013.01); *G09G 2300/0861* (2013.01); *H01L 23/5228* (2013.01); *H01L 27/3279* (2013.01); *H01L 33/40* (2013.01); *H01L 51/5212* (2013.01); *H01L 2251/5315* (2013.01)

(56) References Cited

U.S. PATENT DOCUMENTS

| | | | |
|---|---|---|---|
| 5,227,252 A | | 7/1993 | Murayama et al. |
| 5,368,783 A | | 11/1994 | Kobayashi et al. |
| 5,399,936 A | | 3/1995 | Namiki et al. |
| 5,400,047 A | | 3/1995 | Beesely |
| 5,638,783 A | | 6/1997 | Regueiro |
| 5,643,826 A | | 7/1997 | Ohtani et al. |
| 5,652,067 A | | 7/1997 | Ito et al. |
| 5,661,500 A | | 8/1997 | Shinoda et al. |
| 5,763,899 A | * | 6/1998 | Yamazaki ......... H01L 29/78696 257/347 |
| 5,923,962 A | | 7/1999 | Ohtani et al. |
| 5,932,327 A | | 8/1999 | Inoguchi et al. |
| 6,008,588 A | | 12/1999 | Fujii |
| 6,023,073 A | | 2/2000 | Strite |
| 6,037,712 A | | 3/2000 | Codama et al. |
| 6,087,770 A | | 7/2000 | Kaneko et al. |
| 6,124,604 A | | 9/2000 | Koyama et al. |
| 6,140,766 A | | 10/2000 | Okada et al. |
| 6,285,042 B1 | | 9/2001 | Ohtani et al. |
| 6,320,311 B2 | | 11/2001 | Nakaya et al. |
| 6,335,541 B1 | | 1/2002 | Ohtani et al. |
| 6,359,606 B1 | | 3/2002 | Yudasaka |
| 6,593,691 B2 | | 7/2003 | Nishi et al. |
| 6,608,449 B2 | | 8/2003 | Fukunaga |
| 6,630,687 B1 | | 10/2003 | Koyama et al. |
| 6,633,270 B2 | | 10/2003 | Hashimoto |
| 6,781,162 B2 | | 8/2004 | Yamazaki et al. |
| 6,887,100 B2 | | 5/2005 | Matsueda et al. |
| 6,900,470 B2 | | 5/2005 | Kobayashi et al. |
| 6,992,332 B2 | | 1/2006 | Yamazaki et al. |
| 7,198,515 B2 | | 4/2007 | Matsueda et al. |
| 7,569,988 B2 | | 8/2009 | Ikeda et al. |
| 2001/0024083 A1 | | 9/2001 | Yamazaki et al. |
| 2001/0043046 A1 | | 11/2001 | Fukunaga |
| 2002/0027247 A1 | * | 3/2002 | Arao ................. G02F 1/133305 257/347 |
| 2002/0053670 A1 | | 5/2002 | Ohtani et al. |
| 2002/0158835 A1 | * | 10/2002 | Kobayashi .......... H01L 27/3244 345/100 |
| 2002/0167026 A1 | | 11/2002 | Azami et al. |
| 2002/0180371 A1 | | 12/2002 | Yamazaki et al. |
| 2003/0089905 A1 | * | 5/2003 | Udagawa ............ H01L 27/3262 257/40 |
| 2003/0094895 A1 | | 5/2003 | Okuyama et al. |
| 2003/0222589 A1 | * | 12/2003 | Osame ................ G09G 3/3233 315/169.1 |
| 2004/0003939 A1 | | 1/2004 | Nishi et al. |
| 2004/0032202 A1 | | 2/2004 | Fukunaga |
| 2004/0046164 A1 | | 3/2004 | Kobayashi et al. |
| 2004/0075092 A1 | | 4/2004 | Arao |
| 2004/0084675 A1 | | 5/2004 | Koyama et al. |
| 2004/0119399 A1 | | 6/2004 | Nagayama |
| 2004/0245531 A1 | | 12/2004 | Fuii et al. |
| 2004/0256620 A1 | | 12/2004 | Yamazaki et al. |
| 2005/0012454 A1 | | 1/2005 | Yamazaki et al. |
| 2005/0051776 A1 | | 3/2005 | Miyagi et al. |

FOREIGN PATENT DOCUMENTS

| | | |
|---|---|---|
| JP | 11-214161 A | 8/1999 |
| JP | 2002-033198 A | 1/2002 |
| JP | 2002-040961 A | 2/2002 |
| JP | 2002-318556 A | 10/2002 |
| JP | 2003-216064 A | 7/2003 |
| JP | 2004-139970 A | 5/2004 |

OTHER PUBLICATIONS

Baldo.M et al., "Very High-Efficiency Green Organic Light-Emitting Devices Based on Electrophosphorescence", Appl. Phys. Lett. (Applied Physics Letters) , Jul. 5, 1999, vol. 75, No. 1, pp. 4-6.

Tsutsui.T et al., "Electroluminescence in Organic Thin Films", Photochemical Processes in Organized Molecular Systems, 1991, pp. 437-450.

Tsutsui.T et al., "High Quantum Efficiency in Organic Light-Emitting Devices With Iridium-Complex As a Triplet Emissive Center", Jpn. J. Appl. Phys. (Japanese Journal of Applied Physics), Dec. 15, 1999, vol. 38, No. 12B, pp. L1502-L1504.

* cited by examiner

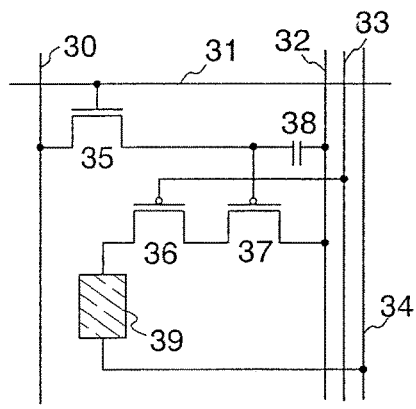
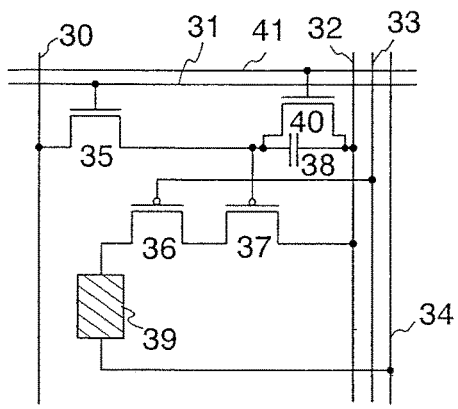
FIG. 7A        FIG. 7B
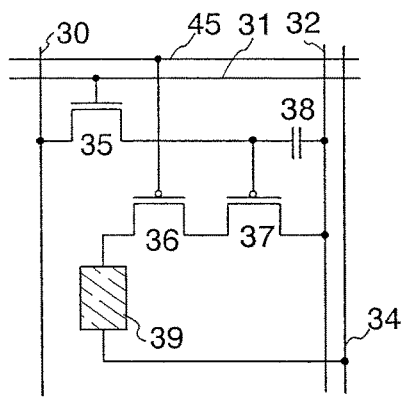
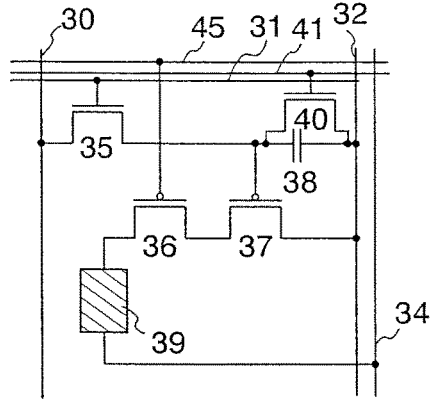
FIG. 7C        FIG. 7D
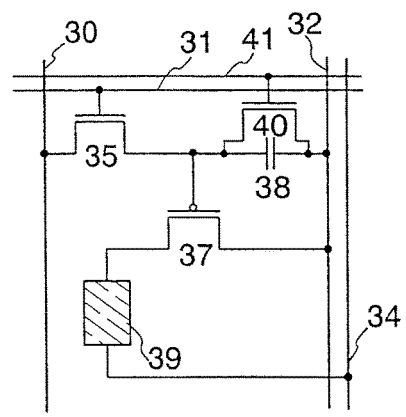
FIG. 7E

DISPLAY DEVICE AND METHOD FOR MANUFACTURING THE SAME

CROSS-REFERENCE TO RELATED APPLICATIONS

This application is a continuation of U.S. application Ser. No. 14/306,309, filed Jun. 17, 2014, now allowed, which is a continuation of U.S. application Ser. No. 13/104,074, filed May 10, 2011, now U.S. Pat. No. 8,759,835, which is a continuation of U.S. application Ser. No. 11/620,120, filed Jan. 5, 2007, now U.S. Pat. No. 7,943,938, which is a continuation of U.S. application Ser. No. 10/867,226, filed Jun. 15, 2004, now U.S. Pat. No. 7,161,184, which claims the benefit of a foreign priority application filed in Japan as Serial No. 2003-171431 on Jun. 16, 2003, all of which are incorporated by reference.

BACKGROUND OF THE INVENTION

1. Field of the Invention

The present invention relates to a display device equipped with a light-emitting element and a method for manufacturing the same.

2. Description of the Related Art

In recent years, a large-sized screen and high-definition are promoted in a display device having a light-emitting element and a liquid crystal element, which the number of wirings such as a signal line and a scanning line, and the length of a wiring tend to increase. Therefore, it is necessary to prevent voltage drop due to wiring resistance, a signal writing defect, a gradation defect, and the like.

Thus, there is a configuration in which an auxiliary wiring made of a transparent conductive film is connected to the transparent electrode that the light-emitting element has, interposing an anisotropical conductor (refer to Patent Document 1). According to Patent Document 1, effective resistance of the transparent electrode can be lowered. Furthermore, it is possible to apply constant voltage to the light-emitting element; therefore, it is mentioned that a display defect such as display unevenness can be prevented. [Patent Document 1] Japanese Patent Laid-Open No. 2002-33198

According to a method different from Patent Document 1, an object of the invention is to provide a display device that can reduce effective resistance of an electrode such as a transparent electrode and a wiring, and furthermore which can apply constant voltage to a light-emitting element.

The display device includes a light-emitting element having a first electrode and a second electrode to apply voltage to a light-emitting layer. The second electrode can be shared in light-emitting elements, that is the second electrode can be formed without patterning over the light-emitting layer in pixels. It is necessary for such second electrode to apply same voltage to the light-emitting elements.

In addition, when light from the light-emitting layer is emitted to an opposite side of a substrate in which a semiconductor element typified by a TFT is provided (hereinafter, referred to as a top emission), the second electrode needs to be transparent. Therefore, the second electrode has a configuration having a transparent conductive film, for example, an ITO (indium tin oxide). However, the resistance of the transparent conductive film is high. Furthermore, the second electrode may use a thin film of a metal film; however, the resistance has become high due to the thin film-thickness. As a result, it is concerned that low power consumption of the display device is disturbed.

Especially, as a display device gets larger in size, it becomes more important to apply constant voltage to the light-emitting layer. However, as mentioned above, resistance of the second electrode is high; and consequently it is concerned that power consumption of a display device is increased.

SUMMARY OF THE INVENTION

Thus, an object of the present invention is to provide a display device which reduces substantial resistance of a second electrode, and which have a new configuration that can apply constant voltage to a light-emitting element.

In the above problems, one feature of the invention is that a conductive film (hereinafter, referred to as an auxiliary wiring) is connected to an electrode typified by the above second electrode, and a wiring.

It is preferable that the auxiliary wiring is formed in a conductive film to include low resistive material, especially, formed to include lower resistive material than the resistance of an electrode and a wiring that needs to reduce the resistance. Specifically, it can be formed to include an element selected from the group consisting Ta, W, Ti, Mo, Al, and Cu, an alloy material or a compound material mainly containing the element, or a transparent conductive film such as ITO and $SnO_2$. In addition, even the case of using an ITO whose height of the resistance is concerned as the auxiliary wiring, the auxiliary wiring is provided, so that the substantial resistance of the second electrode can be reduced.

The above auxiliary wiring can be formed by sputtering, plasma CVD, vapor deposition, printing, or spin coating. The auxiliary wiring may be assumed to have a predetermined shape by using a mask, and furthermore, may have a predetermined shape by etching such as dry etching or wet etching.

Especially, the invention is different from Reference 1 in which the auxiliary wiring connected to a transparent electrode is newly formed. In the invention, the auxiliary wiring is formed in one layer in which a conductive film of a semiconductor element such as an electrode and a wiring, a signal line, a scanning line, or a power supply line is formed. Furthermore, the auxiliary wiring is formed over an insulating film in which a conductive film of a semiconductor element such as an electrode and a wiring, a signal line, a scanning line, or a power supply line is formed. More preferably, the auxiliary wiring is formed by using the same material as the conductive film for an electrode and a wiring, a signal line, a scanning line, or a power supply line of a semiconductor element. Consequently, it is not necessary to provide a step of forming the auxiliary wiring, thereby not increasing the mask for the auxiliary wiring.

As the semiconductor element, a thin film transistor (TFT) using a non-single crystal semiconductor film typified by amorphous silicon and polycrystalline silicon, a MOS transistor formed using a semiconductor substrate and a SOI substrate, a junction transistor, a transistor with the use of an organic semiconductor and carbon nanotube, and other transistors can be applied.

For example, when using a TFT as a semiconductor element, a first insulating film provided by covering at least a gate electrode provided over a semiconductor film, and a second insulating film provided over the first insulating film are included. As the insulating films are laminated, an area for providing the auxiliary wiring can be enlarged, which can decrease the resistance much more.

The first insulating film and the second insulating film can be formed from an inorganic material containing silicon such as silicon oxide, silicon nitride or silicon nitride oxide, or from an organic material containing a material such as polyimide, polyamide, acryl, BCB (benzocyclobutene) or a resist. Furthermore, in order to realize a planarization, the first insulating film, the second insulating film, and the like may be polished with a physical means such as CMP (Chemical Mechanical Polishing).

The auxiliary wiring may be used for a wiring to be lead (hereinafter, lead wiring) for connecting to an external circuit. The lead wiring is provided along the circumference of a panel up to the connecting part with the external circuit, which is preferable to be formed with the auxiliary wiring with a much lower resistance.

In the invention, the auxiliary wiring may be connected to a wiring that low resistance is required, which is not limited to a configuration in which the auxiliary wiring is connected to the second conductive electrode (transparent conductive film).

The invention is not limited to the provision of the auxiliary wiring for the display device comprising a light-emitting element. The auxiliary wiring may be provided also for a display layer comprising a liquid crystal element, and the resistance of an electrode and a wiring may be reduced.

According to the auxiliary wiring of the invention, the substantial resistance of an electrode typified by the second electrode, and a wiring can be reduced. The substantial resistance refers to combined resistance of an electrode or a wiring. As a result, reduction in power consumption and prevention of voltage drop due to an electrode and a wiring in the display device can be obtained.

In addition, a signal writing defect, a gradation defect, and the like due to wiring resistance can be prevented. Furthermore, in the case of the second electrode, the generation of voltage drop can be controlled by connecting it to the auxiliary wiring, so that it is possible to apply uniform amount of voltage to the light-emitting element. Consequently, the improvement of the display quality can be obtained.

Especially in a large display device, an advantageous effect of reducing substantial resistance of an electrode or a wiring is remarkable.

BRIEF DESCRIPTION OF THE DRAWINGS

FIGS. 7A to 7E are views showing pixel circuits of a display device of the invention;

DETAILED DESCRIPTION OF THE PREFERRED EMBODIMENTS

Figure 1A:
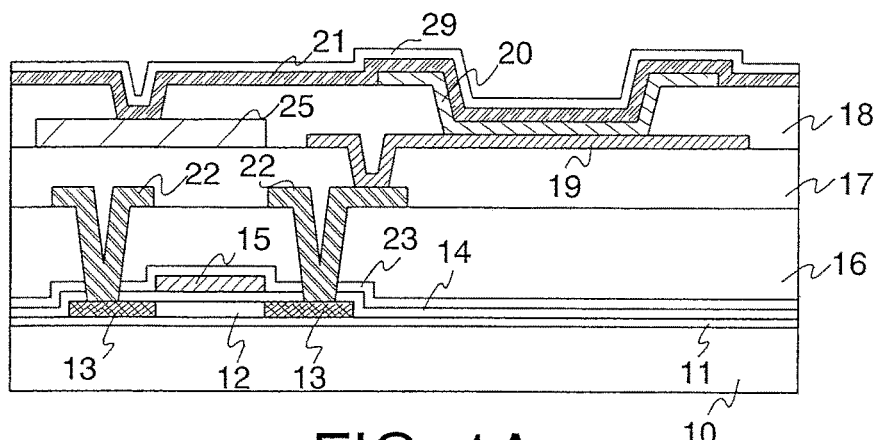
FIGS. 1A to 1C are views showing cross sections of a pixel portion of a display device of the present invention.

Embodiment mode of the present invention will be described below with reference to the accompanying drawings. Note that in all figures for describing the embodiment mode, the same reference numerals denote the same parts or parts having the same function and the explanation will not be repeated.

Embodiment Mode 1

In this embodiment mode, a configuration of a pixel portion of a display device comprising an auxiliary wiring is described.

Figure 1B:
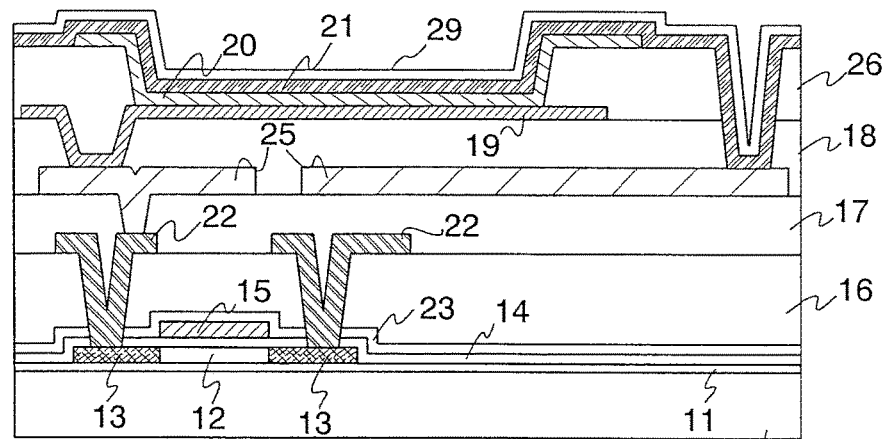
Figure 1C:
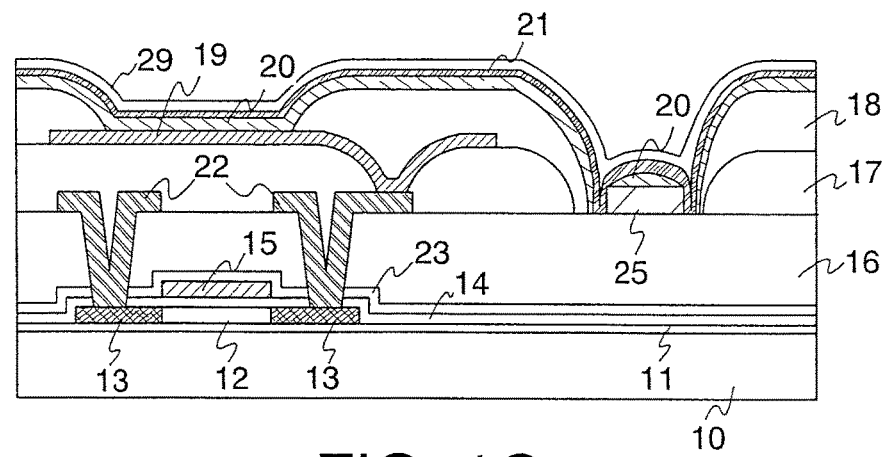

Configurations are shown in FIGS. 1A to 1C. That is, the configuration of a p-channel type TFT using polycrystalline silicon (polycrystalline TFT) as an example of a semiconductor element, and a pixel portion of the display device in which a transparent conductive film is employed as an example of the second electrode and in which the transparent conductive film that is a second electrode is connected to the auxiliary wiring.

In FIG. 1A, a configuration in which the second electrode is connected to the auxiliary wiring, and in which the auxiliary wiring is formed in one layer in which a first electrode is formed is shown. Note that the auxiliary wiring may be formed of either the same material as the first electrode or a different material.

The pixel portion of the display device comprises a base insulating film 11, a semiconductor film 12, a gate insulating film 14, a gate electrode 15, a protective film 23, first to third insulating films 16 to 18, a first electrode 19 for applying voltage to a light-emitting layer 20, a light-emitting layer 20, and a second electrode 21 formed sequentially over an insulating surface 10, and includes an auxiliary wiring 25 in one layer in which the first electrode 19 is formed.

An amorphous semiconductor film, for example, an amorphous silicon film is formed over the base insulating film 11. The semiconductor film 12 of an island shape is formed by patterning the amorphous silicon film into a predetermined shape. The base insulating film 11 may have a configuration in which an insulating film including silicon is laminated, for example, a configuration in which an insulating film such as a silicon oxide film, a silicon nitride film, or a silicon oxynitride film is laminated.

The semiconductor film 12 is crystallized with a laser or by heating. The gate electrode 15 is formed over the semiconductor film (crystalline semiconductor film) that is crystallized. The gate electrode 15 may have a configuration in which a conductive film is laminated, for example, a configuration in which a TaN film is laminated over a W film. An impurity region 13 is formed in a self-alignment manner by using the gate electrode 15 as a mask. For example, the first insulating film 16 has an inorganic material, which is formed to cover the gate electrode and the semiconductor film.

Thereafter, the protective film 23 is heated under the condition that the protective film 23 is formed to cover the gate electrode 15, which the semiconductor film may be recrystallized. Especially in the case of forming the protective film 23 with CVD, source gas may be controlled to contain much hydrogen.

The wirings 22 (a source wiring or a drain wiring) connected to the impurity region 13 are formed through contact holes (opening) provided in the first insulating film 16. In addition, a signal line, a power supply line, and the like are formed in one layer in which the wirings are formed. For example, the second insulating film 17 has an inorganic material, which is formed to cover the wirings, the signal line, the power supply line, and the like.

Through a contact hole provided in the second insulating film 17, the first electrode 19 is formed to connect to the wirings 22. Here, the auxiliary wiring 25 is formed in the layer of the first electrode 19. The auxiliary wiring 25 may be formed using the above material. The third insulating film 18 corresponding to a bank is formed to cover the first electrode 19 and the auxiliary wiring 25. For example, the third insulating film 18 is formed to have an inorganic material. The light-emitting layer 20 is formed over the first electrode 19 interposing a first contact hole provided in the third insulating film 18.

When a full color display is obtained by coloring separately light-emitting layers of each color RGB, a light-emitting layer that emits in white may be formed entirely. When using the light-emitting layer of white light-emitting, a color filter and a color conversion layer may be used for an opposite substrate side to obtain a full color display. In addition, in carrying out a monochromatic display, an area color in which a light-emitting layer of predetermined color is formed may be displayed.

Then, the second electrode 21 is formed to cover the light-emitting layer 20. Here, a second contact hole is provided simultaneously in the third insulating film 18 over the auxiliary wiring 25, in which the second electrode 21 and the auxiliary wiring 25 are connected through the second contact hole. The shape of the second contact hole can be formed to be in a line shape or a dot shape, or the combination thereof.

The first electrode 19 and the second electrode 21 can be an anode or a cathode based on an emitting direction of light and polarity of the semiconductor element. In this embodiment mode, the first electrode 19 is taken as an anode and the second electrode 21 is taken as a cathode, which is described in the case where light is emitted to the second electrode side.

In this case, it is preferable to use a material with a large work function (at least work function 4.0 eV) such as metal, alloy, an electrical conductive compound, and the compound thereof for an anode material. As a specific example of the anode material, gold (Au), platinum (Pt), nickel (Ni), tungsten (W), chromium (Cr), molybdenum (Mo), iron (Fe), cobalt (Co), copper (Cu), palladium (Pd), nitride (TiN), and the like of a metallic material can be used in addition to ITO (indium tin oxide), IZO (indium zinc oxide) mixed zinc oxide (ZnO) of 2 to 20% into indium oxide.

On the other hand, it is preferable to use a material with a small work function (at most work function 3.8 eV) such as metal, alloy, an electrical conductive compound, and the compound thereof for a cathode material. As a specific example of the cathode material, transition metal containing rare-earth metal can be used to form in addition to an element belonging to Group 1 or 2 element of the periodic table, that is, alkali metal such as Li and Cs and alkaline earth metal such as Mg, Ca, and Sr; and alloy containing thereof (Mg:Ag, Al:Li) and the compound (LiF, CsF, $CaF_2$). However, the cathode needs to be transparent; therefore, the metal or alloy containing the metal is formed to be extremely thin, which is formed to laminate with a transparent conductive film such as an ITO.

These anode and cathode can be formed by vapor deposition, sputtering, and the like.

A passivation film 29 comprising an insulating film mainly containing silicon nitride or silicon nitride oxide that is obtained by sputtering (DC system and RF system), or a DLC film (Diamond Like Carbon) containing hydrogen is formed on the second electrode 21.

Accordingly, the pixel portion of the display device can be formed.

The auxiliary wiring 25 is formed over the second insulating film 17 and a configuration of the pixel portion of the display device in which a fourth insulating film is provided is shown in FIG. 1B, which differs from FIG. 1A. Since the other configurations are same as FIG. 1A, it will not be further explained.

The second insulating film 17 is formed so as to cover the wirings 22 to form contact holes. The auxiliary wiring 25 is provided over the second insulating film 17, and the auxiliary wiring 25 is formed in the contact hole. The third insulating film 18 is formed to cover the auxiliary wiring 25 to form contact holes. The first electrode 19 is formed over the third insulating film and in the contact hole, so that the first electrode 19 is connected to the wiring 22 through the auxiliary wiring 25. Furthermore, a fourth insulating film 26 corresponding to a bank is formed to cover the first electrode 19.

The light-emitting layer 20 is formed over the first electrode 19 and the second electrode 21 is formed so as to cover the light-emitting layer 20. Here, through the contact holes formed in the second insulating film 17 and the third insulating film 18, the second electrode 21 is connected to the auxiliary wiring 25.

A laminated constitution of the first to the third insulating films is not limited to FIG. 1B, and furthermore, another insulating films may be laminated. The constitution for laminating the insulating films like FIG. 1B is preferable since the constitution has less restriction on a layout for forming an electrode, a wiring, and the like. Especially, since there is little restriction on an area providing a light-emitting layer, it is possible to enlarge the area of a light-emitting region. Furthermore, there is little restriction on an area for providing the auxiliary wiring; therefore, it is possible to form the auxiliary wiring in a much more enlarged area. As a result, it is possible to provide an electrode and a wring with much more low resistance and to decrease power consumption.

A configuration in which an inorganic material is included in an insulating film is described above; however, an organic material can be used for an insulating film. An organic material has higher planarity compared to an inorganic material. In addition, it can not necessary to carry out etching for forming the contact hole if using appropriate material. Consequently, steps and dust can be reduced. There is a problem of hygroscopicity for an organic material such as acryl and polyimide; therefore, it is preferable to provide a protective film such as a SiN film. Furthermore, resist has lower hygroscopicity compared to an organic material such as acryl and polyimide; therefore, it is preferable that the use of a protective film such as SiN film can be eliminated, and moreover, takes lower cost compared to acryl and polyimide, and it is preferable since a diameter of a contact hole formed by exposing to light gets shorter. However, resist often has color in most of the cases; therefore, a bottom emission type display device in which light is emitted from a substrate side where a semiconductor element typified by a TFT is provided is suitable.

Thereafter, the case where an insulating film is formed using a resist as an organic material is described with reference to FIG. 1C. Other configurations are the same as that of FIG. 1A, which will not be further explained.

First, the wirings 22 so far is formed as in FIG. 1A, and simultaneously the auxiliary wiring 25 is formed. The auxiliary wiring 25 may be formed either of a material same as that of the wirings 22 or a different material.

Thereafter in FIG. 1C, solution in which a cresol resin or the like is melted in solvent (propylene glycol monomethyl ether acetate; PGMEA) is applied as a positive type resist by spin coating. After the resist is applied, the resist is heated at a temperature from 80° C. to 150° C. using a heater (oven, hot plate) or the like and baked (referred to as pre-bake).

After the baking, a mask pattern to form a predetermined contact hole is disposed in the second insulating film 17 and exposed. Then, the mask pattern is transferred to the resist. The positive type resist material is used in this embodiment mode, so that an opening is provided at the position emitted by light. Thereafter, when developer is dropped or sprayed, the position of the resist on which light is emitted melts and the predetermined contact hole is formed in the second insulating film 17. When a negative type material is used instead of the positive type material, an opening is provided at the position not emitted by light, and the position of the resist on which light is not emitted melts in the developer and a contact hole is formed.

In forming an insulating film by using an organic material when the predetermined thickness is not obtained, the solution may be applied repeatedly with each other, and the pre-bake and the application may be carried out over again.

After the contact hole is formed, heat treatment is carried out at temperatures from 120° C. to 250° C. using the heater (oven, hot plate) and the like to take off moisture and the like left within the resist and to stabilize much more (referred to as post-bake) simultaneously.

Among a plurality of contact holes formed in the second insulating film 17, the first electrode 19 is formed in a first contact hole, which is connected to the wirings 22. The auxiliary wiring 25 is exposed in a second contact hole of the second insulating film 17. That is, the second contact hole is formed so that the side surfaces of the auxiliary wiring 25 does not contact with the edge portion of the second insulating film. The auxiliary wiring 25 may be formed after forming the second insulating film 17.

With the use of a resist material identical to that of the second insulating film 17 and a method thereof, the third insulating film 18 corresponding to a bank is formed. A contact hole of the third insulating film 18 is formed so that the auxiliary wiring 25 is exposed entirely. That is, a contact hole is formed so that the edge portion of the third insulating film 18 does not contact with the contact hole.

The light-emitting layer 20 is formed to cover the third insulating film 18. Here, the light-emitting layer 20 is ended off and formed since a film thickness of the light-emitting layer 20 is thin on the side surface of the auxiliary wiring 25. That is, the light-emitting layer 20 is formed besides a part of the surface of the auxiliary wiring 25, specifically, besides a part of the side surface of the auxiliary wiring 25.

The second electrode 21 is formed to cover the light-emitting layer 20. The second electrode 21 can have an electrical connection in order to form up to the side surface of the auxiliary wiring 25. For example, a metal film containing an element belonging to Group 1 or 2 element of the periodic table is formed to be thin. When the second electrode 21 is formed by laminating a transparent conductive film over the metal film, the metal film or the transparent conductive film may be electrically connected to the auxiliary wiring.

That is, in a configuration shown in FIG. 1C, it can be unnecessary to form a contact hole for electrically connecting the auxiliary wiring 25 and the second electrode 21.

In the configuration shown in FIG. 1C, an organic material may be further used for the first insulating film 16. It is preferable to form a plurality of insulating films with the same material since the manufacturing process becomes simple and easy.

Even in configurations shown in FIGS. 1A and 1B, it is possible to form the light-emitting layer 20 to end off over the auxiliary wiring 25 when a contact hole is formed so that an insulating film cannot be provided at the edge portion of the auxiliary wiring 25 and the light-emitting layer is formed over the entire surface of a pixel region.

As shown in FIGS. 1A to 1C, substantial resistance of the second electrode 21 can be reduced by providing the auxiliary wiring 25. As a result, the reduction in the power consumption in the display device can be obtained.

In addition, a signal writing defect or a gradation defect due to wiring resistance can be prevented. Furthermore, in the case of the second electrode 21, the generation of voltage drop can be controlled by connecting with the auxiliary wiring 25, so that it becomes possible to apply same voltage to the light-emitting element. Consequently, the improvement of the display quality can be obtained.

Especially in a large display device, an advantageous effect of reducing the substantial resistance of an electrode and a wiring is remarkable.

Note that a layer for providing the auxiliary wiring is not limited to the configuration shown in this embodiment mode. For example, the auxiliary wiring may be provided in one layer in which the gate electrode is formed. Alternatively, a plurality of the auxiliary wirings formed in a plurality of layers may be connected through the contact holes.

Not limiting to the configuration of a TFT shown in this embodiment mode, a configuration with a low concentration impurity region, a configuration in which an impurity region or a low concentration impurity region overlaps with a gate electrode, a configuration in which a plurality of gate electrodes are provided for a semiconductor film, a configuration in which gate electrodes are provided to above and below of a semiconductor film, and the like can be applied.

This embodiment mode can be applied to a top-emission type display device in which light from a light-emitting layer is emitted to an opposed side of a substrate side where the semiconductor element typified by a TFT is provided, a bottom emission type display device in which light from a light-emitting layer is emitted to a substrate side, and dual emission type display device in which light emits to the both sides.

Embodiment Mode 2

Figure 2A:
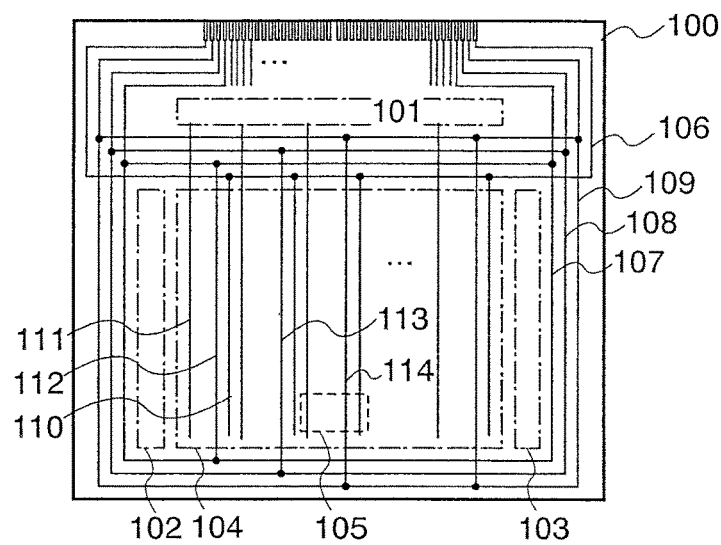
FIGS. 2A and 2B are views showing a display device of the invention.
Figure 2B:
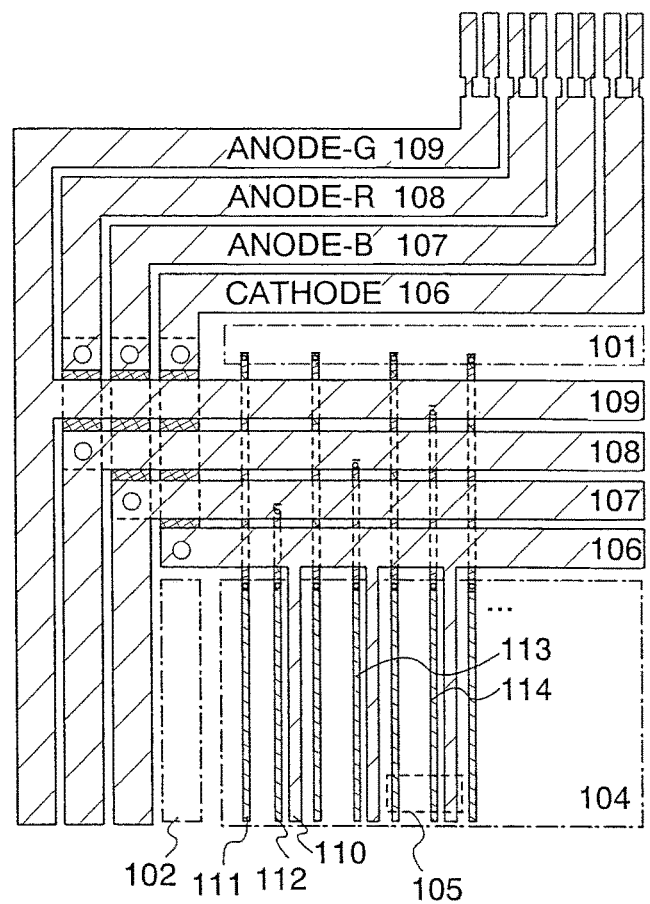

In this embodiment mode, an entire display device, especially, a lead wiring for connecting to an external circuit is described. Especially, a lead wiring with the same potential as high-potential voltage VDD (hereinafter, described as an anode line) and a lead wiring with the same potential as low-potential voltage VSS (hereinafter, described as a cathode line) are described with reference to FIGS. 2A and 2B. In FIGS. 2A and 2B, only a wiring disposed in a column direction in a pixel portion 104 is shown.

FIG. 2A is a top view of a panel, in which the pixel portion 104 where a plurality of pixels 105 are disposed in matrix a signal line driver circuit 101, and scanning line driver circuits 102 and 103 around the pixel portion 104 are disposed on a substrate. The number of these driver circuits is not limited to FIG. 2A, and a plurality of signal line driver circuits or a single scanning line driver circuit may be disposed according to a configuration of the pixels 105.

Signal lines 111 disposed in a column direction within the pixel portion 104 are connected to the signal line driver circuit 101. Power supply lines 112 to 114 disposed in a column direction are each connected to any one of anode lines 107 to 109. Auxiliary wiring 110 disposed in a column direction is connected to a cathode line 106. The anode lines 107 to 109 and the cathode line 106 are led so as to surround the driver circuits disposed in the pixel portion 104 and the periphery, which is connected to a terminal of an anisotropic film (FPC: Flexible Printed Circuit) connecting to the external circuit.

It is preferable that the anode lines 107 to 109 are formed corresponding to one of the colors of RGB. This is because the change of each of the potential of the anode lines 107 to 109 can correct variation of a luminance generated between each color. That is, a current density of electroluminescent layers of light-emitting elements differs in each color; therefore, the problem that a luminance becomes different in each color even under the same current value can be resolved.

In this embodiment mode, it is assumed that case where a light-emitting layer of RGB is colored separately. However, as a method of colorization, when a method in which the difference of a current density in each color is not problematic, for example, when a method for using a light-emitting layer that emits white and a color filter is adopted, it is not necessary to provide a plurality of anode lines.

FIG. 2B is a mask layout diagram, in which the anode lines 107 to 109 and the cathode line 106 are disposed around the signal line driver circuit 101, and the anode lines 107 to 109 are connected with the power supply lines 112 to 114 disposed in a column direction in the pixel portion 104 through a contact hole.

In this embodiment mode, the cathode line 106, the anode lines 107 to 109 are formed of a conductive film of one layer in which the auxiliary wirings 110 is formed. The auxiliary wiring 110 is formed of a material with lower resistance; therefore, it is preferable to assume the cathode line 106 and the anode lines 107-109 that are led so as to surround the driver circuit as a conductive film of one layer.

After forming the cathode line 106, the anode lines 107 to 109, and the auxiliary wirings 110, the first electrode of a light-emitting element is formed, and an insulating film corresponding to a bank is formed. A contact hole is formed in the insulating film which is placed over a region in which the cathode line 106 is formed, a region forming a light-emitting layer, and a region in which the auxiliary wiring is formed. The cathode 106, the first electrode, and the auxiliary wirings 110 are exposed by forming the contact hole. As shown in FIGS. 1A to 1C, a light-emitting layer is formed over the contact hole on the first electrode. Here, a light-emitting layer of each RGB may be colored separately by a metal mask to evaporate, and a white light-emitting layer may be evaporated to the entire surface.

Next, a second electrode that covers the light emitting layer is formed. Here, the second electrode formed on the light-emitting layer is connected not only to the cathode lines 106 but also to the auxiliary wirings 110 disposed in a column direction within the pixel portion 104. Due to the configuration in which the second electrode and the auxiliary wiring 110 are connected in the pixel portion, the substantial resistance of the second electrode can be reduced. Therefore, the problem of a defect in image quality and a high power consumption due to resistance of the second electrode can be improved.

A layer for forming the auxiliary wirings 110 is not limited to a conductive film of which layer is the same as the signal lines as shown in FIG. 2B, and a conductive film of one layer in which the scanning lines are formed may be used. In addition, a shape of the contact hole between the auxiliary wirings 110 and the second electrode is not limited to FIG. 2B, and it may be provided in a linear shape or in a spotted shape in a column direction. Hereinafter, a layout of the contact holes between the auxiliary wirings 110 and the second electrode is described with reference to FIGS. 3 to 6 by giving some examples. Note that the signal lines 111, the auxiliary wirings 110, the cathode line 106, and scanning lines 120 in a pixel portion 104 are shown in FIGS. 3 to 6.

Figure 3:
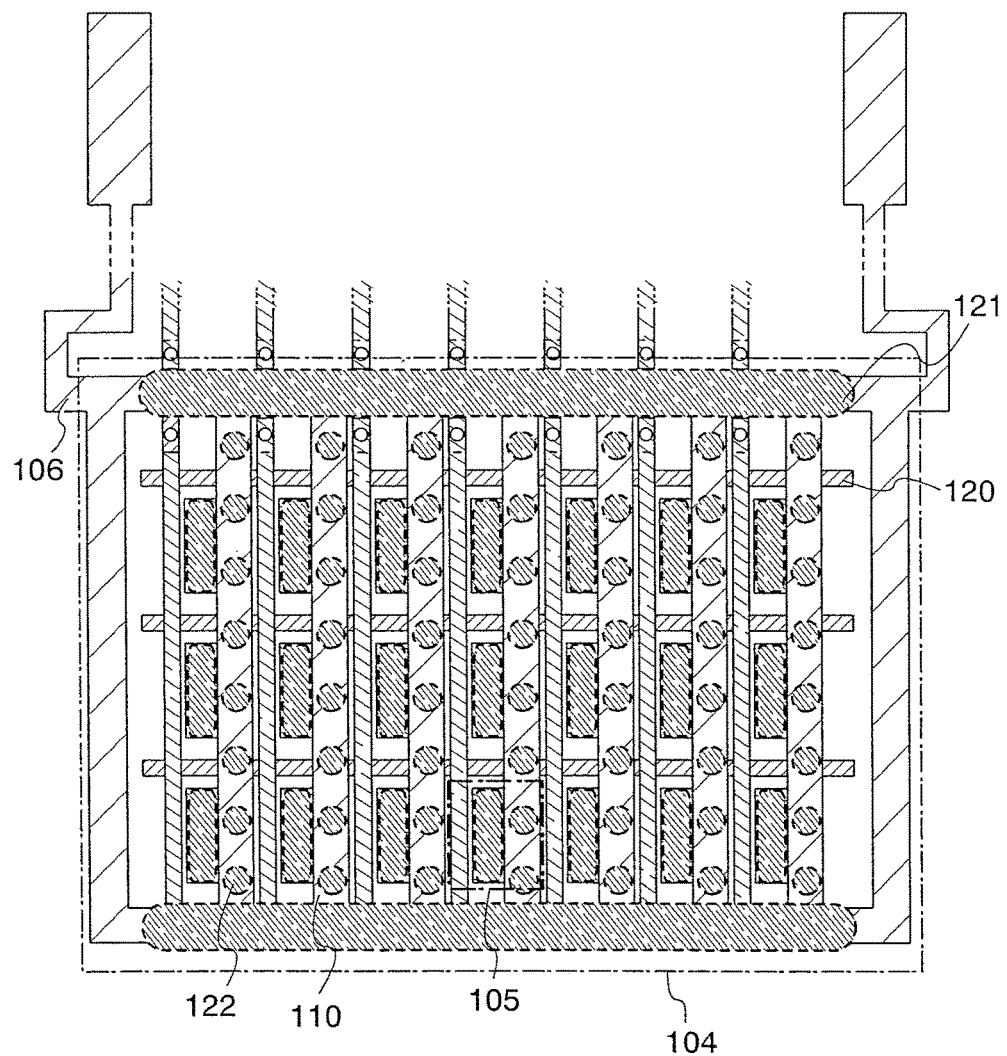
FIG. 3 is a view showing an auxiliary wiring in a display device of the invention.

In FIG. 3, a contact region 121 of the auxiliary wirings 110 and the cathode line 106 is formed. The auxiliary wirings 110 and the second electrode in each pixel 105 are connected through contact holes 122 in a round shape (dot shape).

Figure 4:
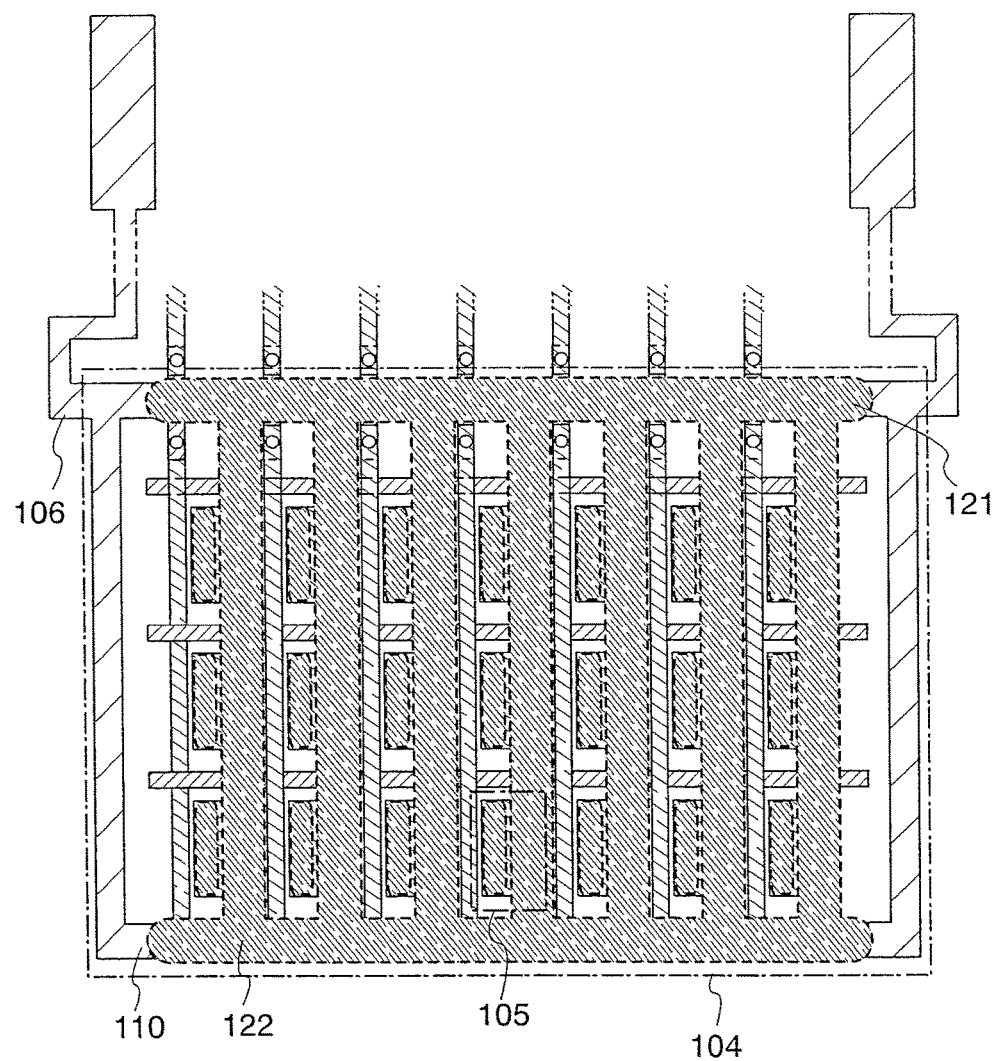
FIG. 4 is a view showing an auxiliary wiring in a display device of the invention.

In FIG. 4, the contact region 121 of the auxiliary wirings 110 and the cathode line 106 is formed. The auxiliary wirings 110 and the second electrode in each pixel 105 are connected through contact holes 122 in a linear shape (line shape). In other words, the contact region 121 and the contact holes 122 in a linear shape are formed simultaneously and connected.

The contact holes 122 shown in FIG. 4 are formed to be larger than the auxiliary wirings 110. In the case of the configuration shown in FIG. 1C, the contact holes 122 are bigger than the auxiliary wirings 110. In the case of the configuration shown in FIGS. 1A and 1B, the contact holes 122 are smaller than the auxiliary wirings 110.

Figure 5:
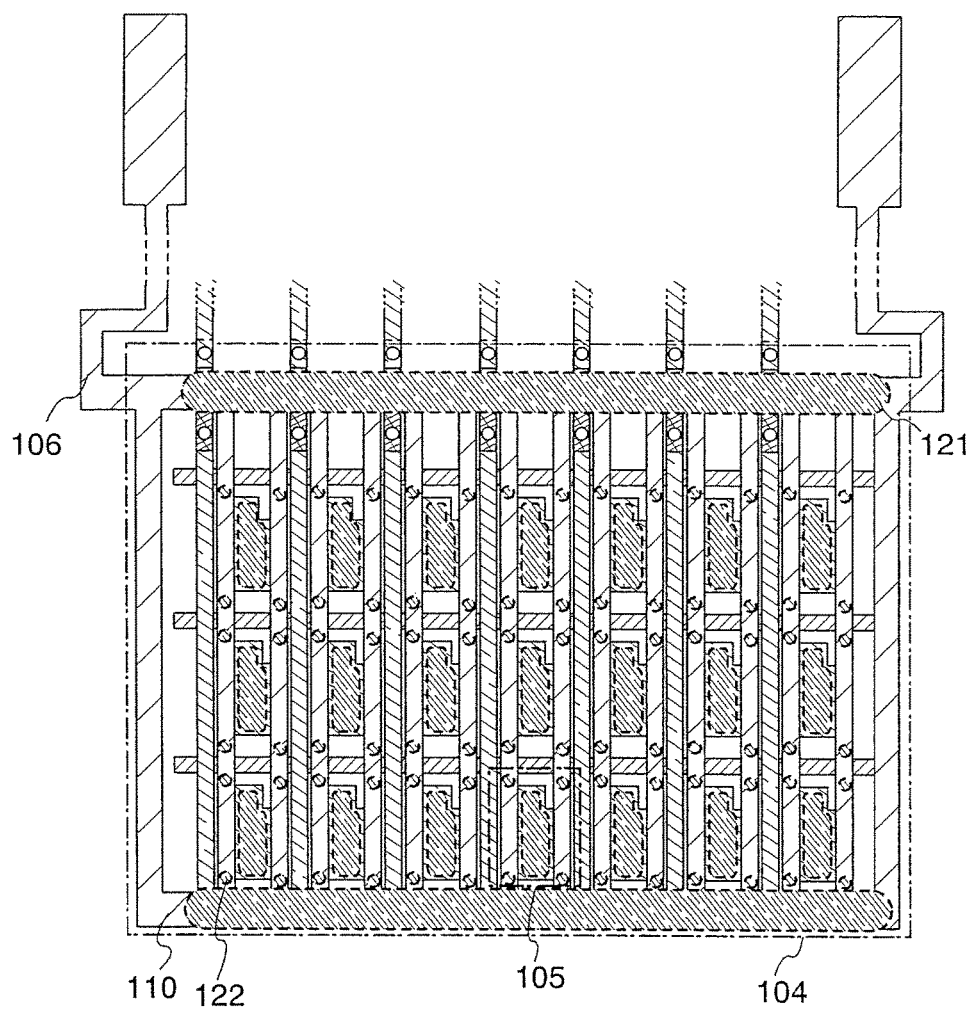
FIG. 5 is a view showing an auxiliary wiring in a display device of the invention.

In FIG. 5, the contact region 121 of the auxiliary wirings 110 and the cathode line 106 is formed. The two auxiliary wirings 110 are provided in each pixel 105, in which these auxiliary wirings 110 and the second electrode are connected through the contact holes 122 in a round shape (dot shape). The contact holes 122 in a round shape are formed at four corners of each pixel.

Accordingly, a plurality of auxiliary wirings 110 may be provided in one pixel. Furthermore, the plurality of auxiliary wirings 110 may be provided by laminating them.

Figure 6:
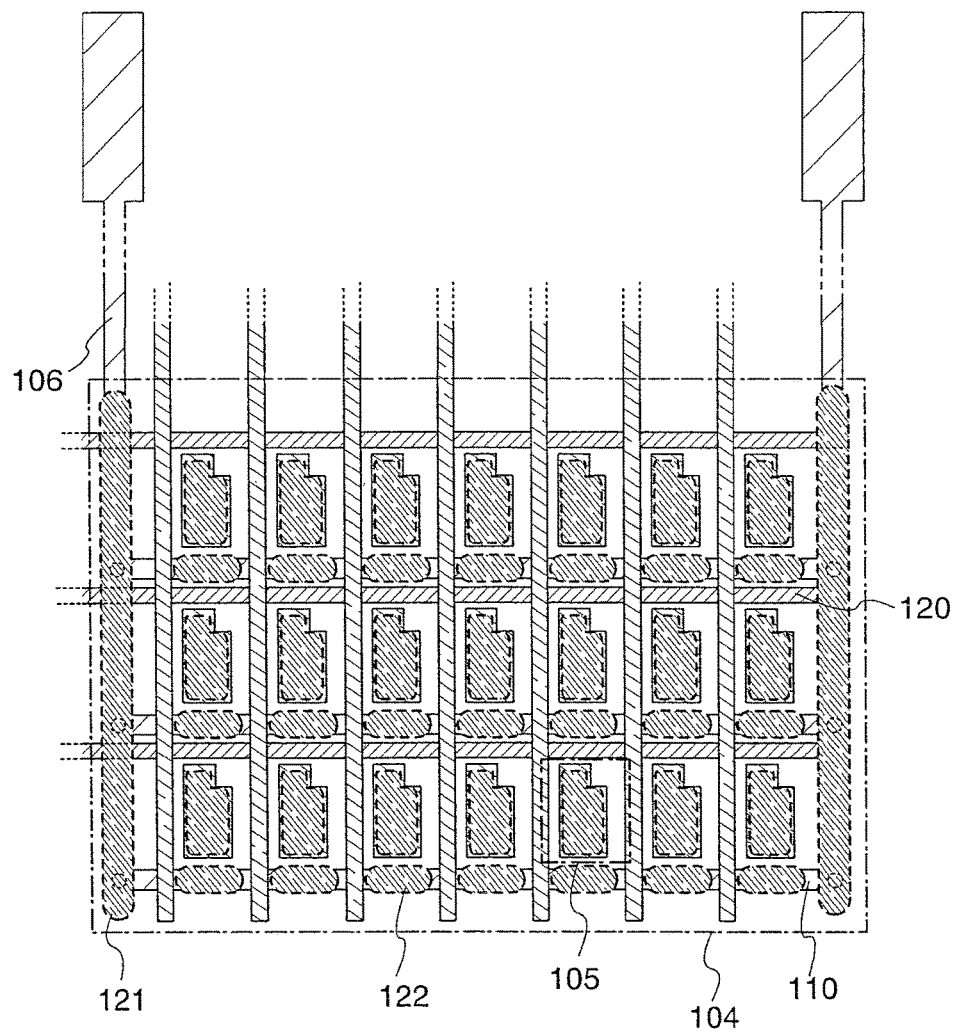
FIG. 6 is a view showing an auxiliary wiring in a display device of the invention.

In FIG. 6, the auxiliary wirings 110 are formed in one layer in which the gate wiring is formed. The contact region 121 of the auxiliary wirings 110 and the cathode line 106 is formed, in which the auxiliary wirings 110 and the second electrode in each pixel 105 are connected through a shape with some area (area shape).

As shown in FIGS. 3 to 6, there can be various layouts of the contact holes 122 with the auxiliary wirings 110 and the second electrode. A shape of the contact holes such as a round shape, a linear shape, or an area shape can be combined with any one of the configurations shown in FIGS. 3 to 6.

When the connection between the auxiliary wirings 110 and the second electrode is made enough through the contact holes 122 in the pixel portion, the contact region 121 with the cathode line 106 and the cathode line 106 below the contact region 121 can be unnecessary. In this case, it is preferable to use one layer in which the auxiliary wiring, the gate wiring, or source and drain wirings is formed for the lead wiring for connecting the second electrode to the FPC.

Embodiment Mode 3

In this embodiment mode, an equivalent circuit of a pixel portion of a display device is described.

A pixel circuit shown in FIG. 7A comprises a light-emitting element 39, a signal line 30 in which a video signal is input, a transistor (switching transistor) 35 used for a switching element for controlling the input of the video signal into a pixel, a transistor (drive transistor) 36 for controlling current value flown into the light-emitting element 39, a transistor (current control transistor) 37 for controlling the supply of current to the light-emitting element 39, and an auxiliary wiring 34 connected with a second electrode of the light-emitting element 39. Furthermore, a capacitor element 38 for holding the potential of the video signal may be provided.

The drive transistor 36 and the current control transistor 37 are formed so as to have a same conductivity type. This embodiment mode describes the case of a p-channel type.

In this embodiment mode, the drive transistor 36 is operated in a saturation region, and the current control transistor 37 is operated in a linear region. Therefore, the L(channel length) of the drive transistor 36 may be longer than the W(channel width), and the L(channel length) of the current control transistor 37 may be the same or shorter than the W W(channel width). More preferably, the ratio of the drive transistor 36 of the W(channel width) to the L(channel length) may be no fewer than 5.

An enhancement mode transistor may be used or a depletion mode transistor may be used for the drive transistor. This embodiment mode is described in the case where a depletion type transistor is used.

A gate electrode of the switching transistor 35 is connected to a scanning line 31. As for a source region and a drain region of the switching transistor 35, one is connected to the signal line 30 and the other is connected to a gate electrode of the current control transistor 37. A gate electrode of the drive transistor 36 is connected to a second power supply line 33. The drive transistor 36 and the current control transistor 37 are connected to a first power supply line 32 and the light-emitting element 39, so that a current supplied by the first power supply line 32 is supplied to the light-emitting element 39 as drain currents of the drive transistor 36 and the current control transistor 37. In this embodiment mode, a source region of the current control transistor 37 is connected to the first power supply line 32, and the drain region of the drive transistor 36 is connected to a first electrode of the light-emitting element 39.

Note that a source region of the drive transistor 36 is connected to the first power supply line 32, and the drain region of the current control transistor 37 may be connected to the first electrode of the light-emitting element 39.

Potential difference is given to the second electrode and the first power supply line 32 respectively so that current of forward bias direction is provided to the light-emitting element 39.

Furthermore, the second electrode is connected to the auxiliary wiring 34, which reduces the substantial resistance of the second electrode. It is preferable to form the auxiliary wiring 34 using a conductive film of one layer in which the signal line 30, the first power supply line 32, and the second power supply line 33 are formed, and the auxiliary wiring 34 may be formed in one layer in which the first electrode is formed as shown in FIG. 1A.

One of two electrodes comprised in a capacitor element 38 is connected to the first power supply line 32, and the other is connected to the gate electrode of the current control transistor 37. When the switching transistor 35 is in a non-selected state (OFF state), the capacitor element 38 is provided to keep potential difference between electrodes of the capacitor element 38. However, when the leak current from each transistor is small, the gate capacitance of the switching transistor 35, the drive transistor 36, or the current control transistor 37 is large, it is not necessary to provide the capacitor element 38.

The drive transistor 36 and the current control transistor 37 are p-channel type transistors, in which the source region of the drive transistor 36 and an anode of the light-emitting element 39 are connected in FIGS. 1A, to 1C. Conversely, when the drive transistor 36 and the current control transistor 37 are n-channel type transistors, the source region of the drive transistor 36 and a cathode of the light-emitting element 39 are connected.

Next, a driving method of a pixel shown in FIG. 7A is described by dividing into a writing period and storage time. First, when the scanning line 31 is selected in the writing period, the switching transistor 35 connected to the scanning line 31 is turned ON. Then, the video signal input to the signal line 30 is input to the gate electrode of the current control transistor 37 through the switching transistor 35. The drive transistor 36 is connected to the first power supply line 32; therefore, it is always turned ON.

When the current control transistor 37 is turned ON by a video signal, a current is flown through the light-emitting element 39 through the first power supply line 32. Here, since the current control transistor 37 is operated in a linear region, the current flown through the light-emitting element 39 depends on the drive transistor 36 operated in a saturation region and a current-voltage characteristic of the light-emitting element 39. The light-emitting element 39 emits light in a luminance corresponding to the current that is provided.

In addition, when the current control transistor 37 is turned OFF by a video signal, the light-emitting element 39 is not supplied with a current.

In the storage time, the switching transistor 35 is turned OFF by controlling the potential of the scanning line 31, in which the potential of the video signal written in the writing period is held. When the current control transistor 37 is turned ON in the writing period, the potential of the video signal is held by the capacitor element 38; therefore, the light-emitting element 39 is continued to be supplied with a current. On the contrary, when the current control transistor, 37 is turned OFF in the writing period, the potential of the video signal is held by the capacitor element 38; therefore, the light-emitting element 39 is not supplied with a current.

A pixel circuit shown in FIG. 7B is different from that shown in FIG. 7A in a configuration in which a transistor (erase transistor) 40 is provided to erase the potential of the written video signal. A gate electrode of the erase transistor 40 is connected to a second scanning line 41, as for a source and a drain, one is connected to the first power supply line 32 and the other is connected to the gate electrode of the current control transistor 37.

Other configurations are the same as that shown in FIG. 7A, and the second electrode of the light-emitting element 39 is connected to the auxiliary wiring 34, which reduces the substantial resistance of the second electrode.

Next, a driving method of a pixel shown in FIG. 7B can be described by separating into an erase period in addition to a writing period and a storage time.

In the erase period, the second scanning line 41 is selected to turn the erase transistor 40 ON, in which the potential of the power supply line 32 is given to the gate electrode of the current control transistor 37 through the erase transistor 40. Accordingly, the current control transistor 37 is turned OFF; therefore, a state in which the light-emitting element 39 is forced not to supply with a current can be made.

A pixel circuit shown in FIG. 7C is different from that of FIG. 7A in a configuration in which the gate electrode of the drive transistor 36 is connected to a third scanning line 45. The gate electrode of the drive transistor 36 may be connected to a wiring provided with a constant potential. It is preferable to form the auxiliary wiring 34 by using a conductive film of one layer in which the first scanning line 31 and the third scanning line 45 are formed.

Other configurations are the same as that of FIG. 7A, and the second electrode of the light-emitting element 39 is connected to the auxiliary wiring 34, which reduces the substantial resistance of the second electrode.

A driving method of a pixel shown in FIG. 7C is the same as the driving method described referring to FIG. 7A, which will not be further explained.

Similar to FIG. 7B, a pixel circuit shown in FIG. 7D has a configuration in which the erase transistor 40 is provided for the pixel circuit shown in FIG. 7B.

Other configurations are the same as that of FIG. 7C, and the second electrode of the light-emitting element 39 is connected to the auxiliary wiring 34, which reduces the substantial resistance of the second electrode.

The driving method of a pixel shown in FIG. 7C is the same as the driving method described referring to FIG. 7B, which will not be further explained.

A pixel circuit shown in FIG. 7E is different from that of FIG. 7B in a configuration in which the driving transistor 36 is not provided.

It is preferable to operate the current control transistor 37 in a saturation region so that the drive transistor 36 is not affected by the degradation of the light-emitting element. In operating the drive transistor 36 in a saturation region, it is necessary to consider voltage including a margin of voltage drop due to the second electrode and a margin of the degradation of the light-emitting element. However, the margin of the voltage drop due to the second electrode can be made unnecessary by the auxiliary wiring, which can result in a low power consumption of the display device.

Other configurations are the same as that of FIG. 7A, and the second electrode of the light-emitting element 39 is connected to the auxiliary wiring 34, which reduces the substantial resistance of the second electrode.

A driving method of a pixel shown in FIG. 7E is the same as the driving method described referring to FIG. 7B, which will not be further explained.

Similar to FIGS. 7A and 7C, it is needless to say that an erase transistor may not be provided in the pixel circuit in FIG. 7E.

Although the case of the pixel type in which the voltage signal is input as the video signal into the signal line 30 is described in FIGS. 7A to 7E, a pixel type in which a current signal is input as the video signal into the signal line 30 may be used. Since the substantial resistance of a wiring and an electrode can be reduced, the voltage drop due to the high resistance can be prevented. Therefore, the configuration having the auxiliary wiring applied in accordance with the pixel type in which the voltage signal is input results in a prominent advantageous effect.

In addition, the pixel circuit having the light-emitting element is described; however, a configuration including the auxiliary wiring in a pixel circuit having a liquid crystal element may be used.

Embodiment Mode 4

In this embodiment mode, an example of a top view of a pixel portion corresponding to the equivalent circuit shown in FIG. 7B is described.

Figure 8:
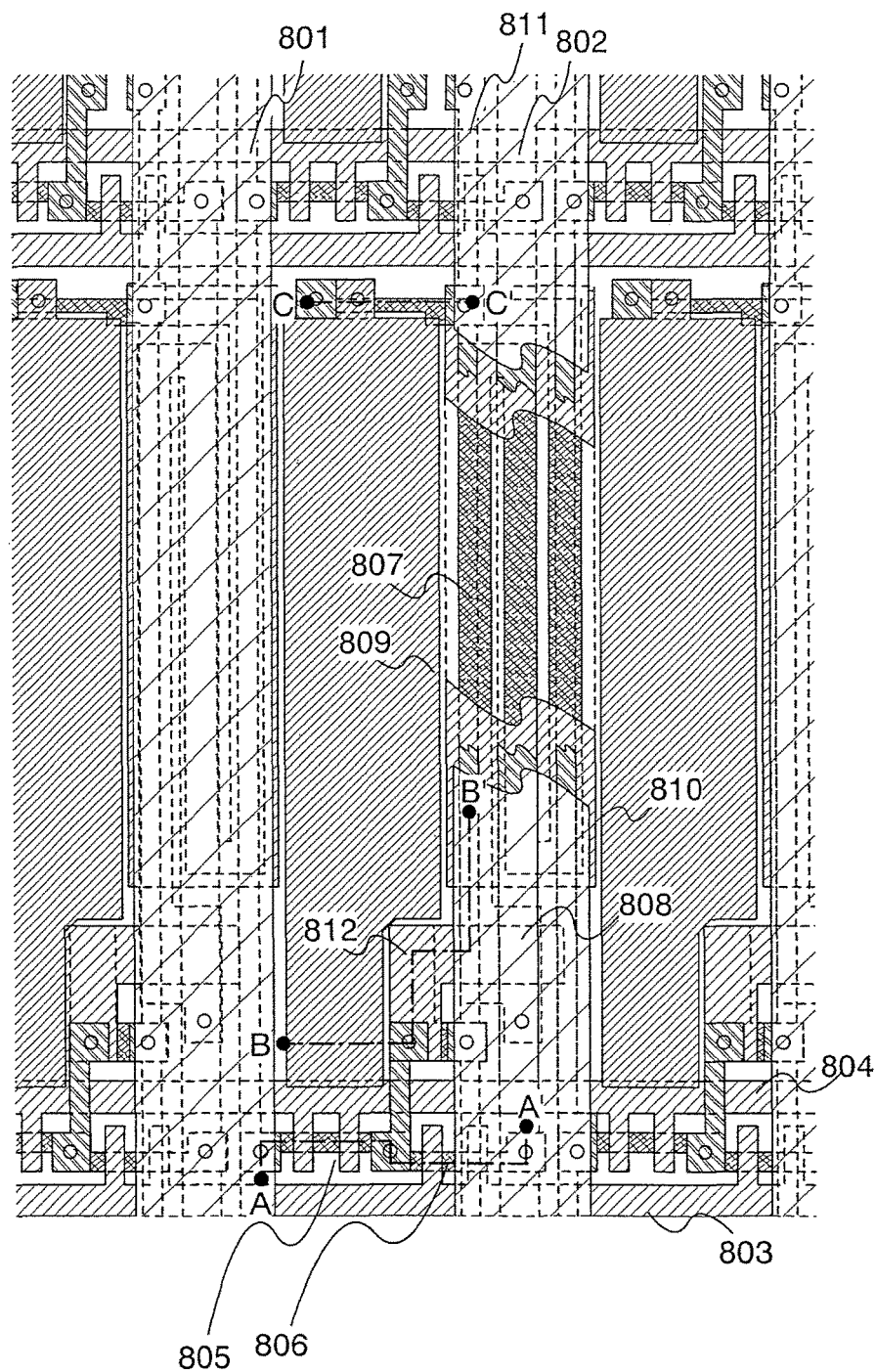
FIG. 8 is a top view showing a pixel portion of a display device of the invention.

FIG. 8 comprises a signal line 801, a first power supply line 802, a second scanning line 803, a first scanning line 804, a switching transistor 805, an erase transistor 806, a drive transistor 807, a current control transistor 808, a first electrode 809, an auxiliary wiring 810, a second power supply line 811, and a capacitor element 812.

In this embodiment mode, the signal line 801, the first power supply line 802, and the second power supply line 811 are formed by patterning the same conductive film as signal line 801 and so on. In addition, a source wiring and a drain wiring of a transistor are formed of the same conductive film. The first scanning line 804 and the second scanning line 803 are formed by patterning the same conductive film. Furthermore, a part of the first scanning line 804 and the second scanning line 803 are overlapped with a portion of semiconductor film, and being operating as a gate electrode.

The auxiliary wiring 810 is formed by interposing an insulating film over the first power supply line 802 and the second power supply line 811. Therefore, the auxiliary wiring 810 in a large area can be formed. When capacitance is generated between the auxiliary wiring and the first power supply line, and the auxiliary wiring and the second power supply line, a part of the auxiliary wiring may be used as a capacitor element. In addition, an unnecessary capacitance can be decreased by using a Low-K material for an insulating film. It is also possible to form the auxiliary wiring 810 in one layer in which the first power supply line 802 and the second power supply line 811 are formed. In this case, a film thickness of the auxiliary wiring is decided in order to obtain predetermined resistance.

In order to operate the drive transistor 807 in a saturation region, it is designed so that L(channel length)/W(channel width) being bigger than that of the current control transistor 808. For example, it is set that (L(channel length)/W(channel width) of the driving transistor):(L(channel length)/W (channel width) of the current control transistor)=(5 to 6000):(1). Therefore, a semiconductor film of the drive transistor 807 is formed in a rectangular.

The capacitor element 812 comprises a protective film containing SiN sandwiched between the second power supply line 811 and the semiconductor film of the drive transistor 807, and a second insulating film.

Figure 9A:
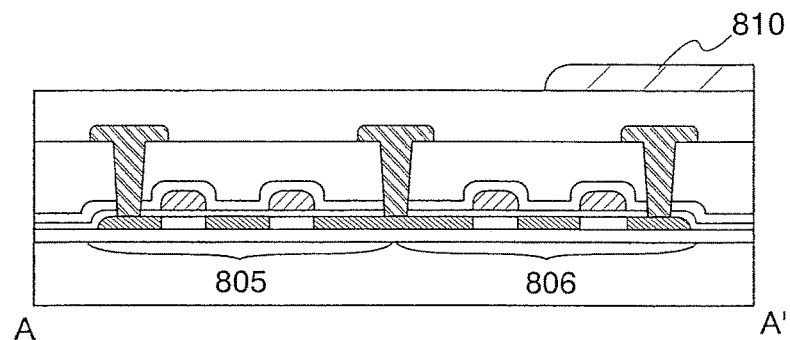
FIGS. 9A to 9C are views showing cross sections of a pixel portion of a display device of the invention.
Figure 9B:
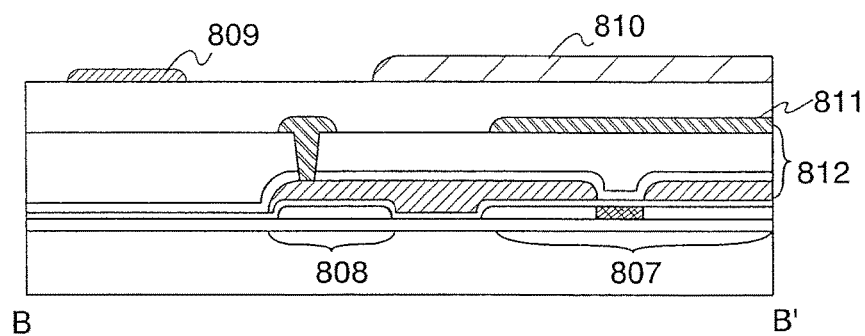
Figure 9C:
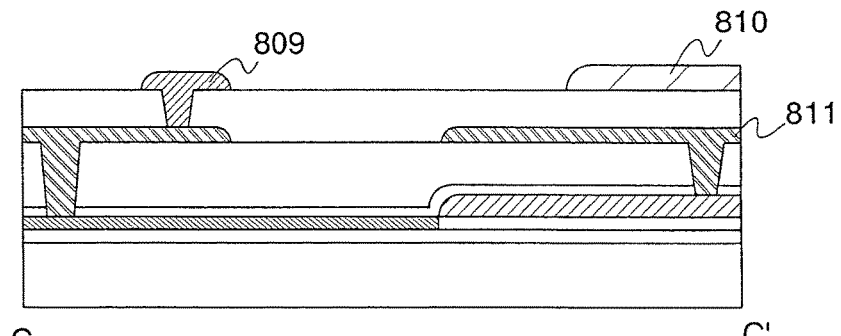

Next, FIGS. 9A to 9C show a cross-sectional views of devices in which the auxiliary wiring 810 is formed.

FIG. 9A corresponds to a cross-section of A-A' in FIG. 8, which shows the cross-sectional view of the switching transistor 805 and the erase transistor 806, and the auxiliary wiring 810 formed over the erase transistor 806.

FIG. 9B corresponds to a cross-section of B-B' in FIG. 8, which shows a cross-sectional view of the drive transistor 807; the capacitor element 812 formed by sandwiching the second power supply line 811 and the semiconductor film of the drive transistor 807; a part of a semiconductor film of the current control transistor 808; the first electrode 809; and the auxiliary wiring 810. The drive transistor 807 and the current control transistor 808 may have a LDD (Lightly Doped Drain) structure with a low concentration impurity region or a GOLD (Gate-drain Overlapped LDD) structure in which a low concentration impurity region overlapped by a gate electrode.

FIG. 9C corresponds to a cross-section of C-C' in FIG. 8, which shows a cross-sectional view of the second power supply line 811, the first electrode 809, and the auxiliary wiring 810.

Figure 10A:
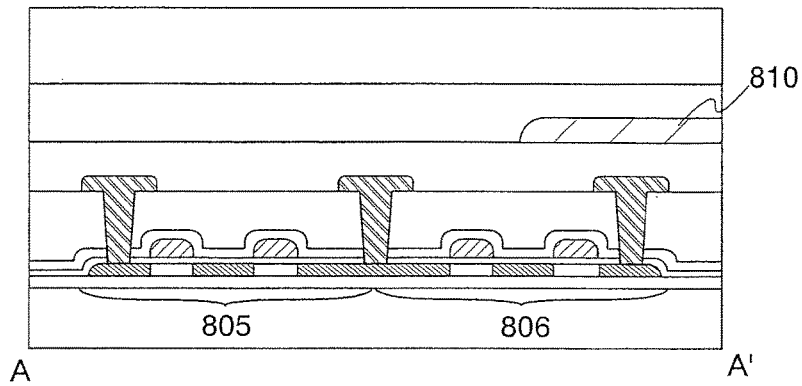
FIGS. 10A to 10C are views showing cross sections of a pixel portion of a display device of the invention.
Figure 10B:
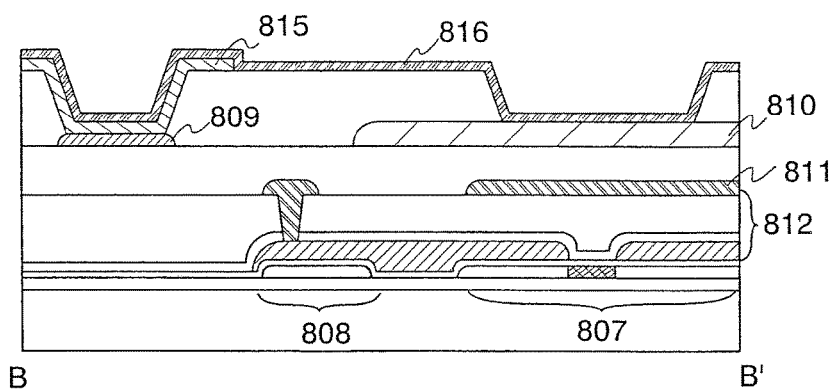
Figure 10C:
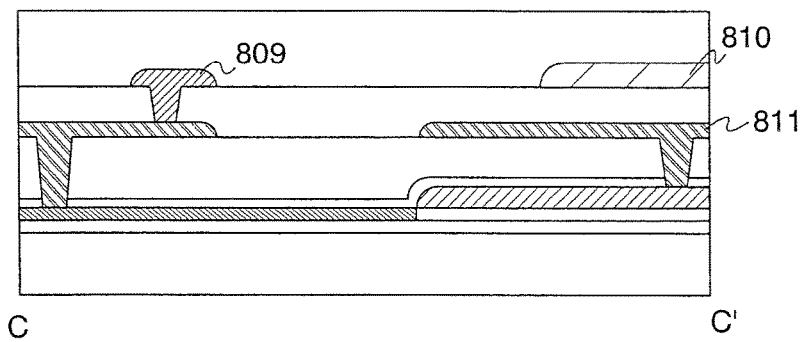

FIGS. 10A to 10C show cross-sectional views in which a third insulating film corresponding to a bank is formed on the auxiliary wiring 810, a light-emitting layer 815 is formed in an opening of the third insulating film, and a second electrode 816 is formed covering the light-emitting layer 815.

FIGS. 10A and 10C correspond to a cross-section of A-A' and C-C' in FIG. 8, each of which shows a cross-sectional view of the case where the third insulating film is formed over the auxiliary wiring 810. In addition, FIG. 10B corresponds to a cross-section of B-B' in FIG. 8, which shows a cross-sectional view in which a first contact hole and a second contact hole are formed in the third insulating film over the first electrode 809 and the auxiliary wiring 810, the light-emitting layer 815 is formed in the first contact hole, and a second electrode is formed in the second contact hole covering the light-emitting layer 815.

Configurations shown in FIGS. 8A to 10C correspond to the configuration shown in FIG. 1A; however, also the configurations shown in FIGS. 1B and 1C can be used in this embodiment mode.

Thus, the second electrode 816 and the auxiliary wiring 810 are connected, which can reduces the substantial resistance. Consequently, reduction in the power consumption of the display device can be achieved.

In addition, a signal writing defect, a gradation defect, and the like due to a wiring resistance can be prevented. Furthermore, in the case of the second electrode, voltage drop can be suppressed by being connected to the auxiliary wiring, so that it becomes possible to apply same voltage to light-emitting elements. Consequently, the improvement of the display quality can be obtained.

Especially in a large display device, an advantageous effect of reducing the substantial resistance of an electrode and a wiring is remarkable.

Embodiment Mode 5

A display device and an electronic device of the present invention include a video camera, a digital camera, a goggle type display (head mounted display), a navigation system, an audio reproducing device (a car audio, an audio component, and the like), a laptop computer, a game machine, a portable information terminal (a mobile computer, a cellular phone, a portable game machine, an electronic book, or the like), an image reproducing device (specifically a device capable of producing a recording medium such as a Digital Versatile Disc (DVD) and having a display device that can display the image) and the like. Especially, it is preferable to use the auxiliary wiring of the invention for a large-sized television with a large-sized screen and the like. Specific examples of the electronic devices are shown in FIGS. 13A to 13C.

Figure 13A:
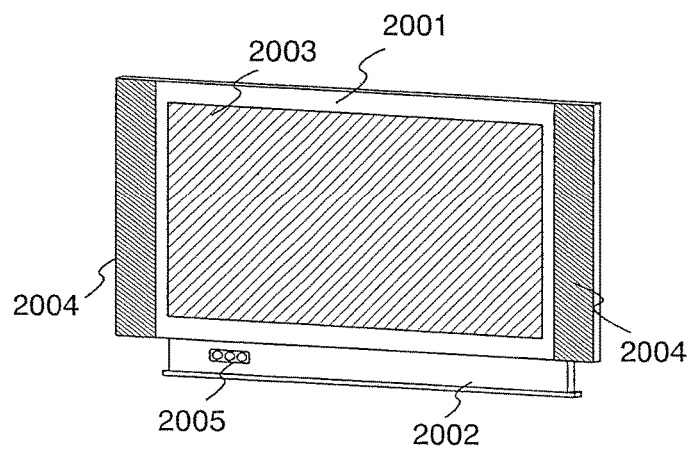
FIGS. 13A to 13C are views showing electronic devices of the invention.

FIG. 13A is a large-sized display device, which includes a chassis 2001, a support 2002, a display portion 2003, a speaker portion 2004, and a video input terminal 2005. The auxiliary wiring of the invention is connected to a wiring and an electrode provided for the display portion 2003, which can reduce the substantial resistance of the wiring and the electrode. As a result, voltage drop and depression of a signal can be reduced in a large-sized display device with a long wiring length. The display device includes every display devices for displaying information for a personal computer, for a TV broadcast reception, for an advertisement display, and the like.

Figures 13B, 13C:
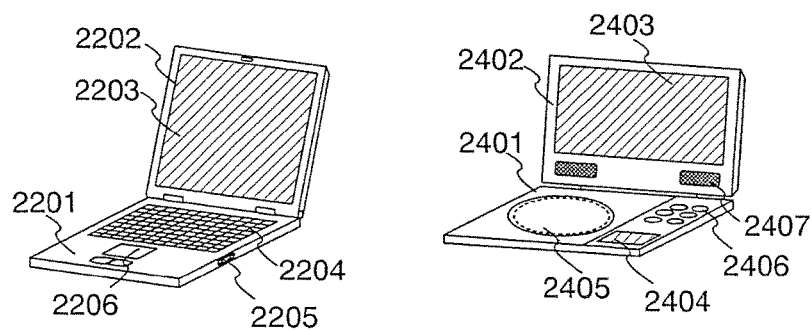

FIG. 13B is a laptop computer, which includes a main body 2201, a chassis 2202, a display portion 2203, a keyboard 2204, an external connection port 2205, a pointing mouse 2206, and the like. The auxiliary wiring of the invention is connected to a wiring and an electrode provided for the display portion 2203, which can reduce the substantial resistance of the wiring and the electrode.

FIG. 13C is a portable image reproduction device equipped with a recording medium (specifically, a DVD player), which includes a main body 2401, a chassis 2402, a display portion A 2403, a display portion B 2404, a recording medium (a DVD players and the like) reading portion 2405, operation keys 2406, speaker portions 2407, and the like. The display portion A 2403 mainly displays image information whereas the display portion B 2404 mainly displays text information. The auxiliary wiring of the invention is connected to wirings and electrodes provided for these display portions A 2403 and B 2404, which can reduce the substantial resistance of the wirings and the electrodes. The image reproduction device equipped with a recording medium includes home video game machines and the like.

As described above, the application range of the invention is extremely wide; therefore, the invention can be applied to the electronic devices of every field. In addition, the electronic devices shown in this embodiment mode can use any one of configurations shown in Embodiment Mode 1 to 4.

Embodiment

Figure 11:
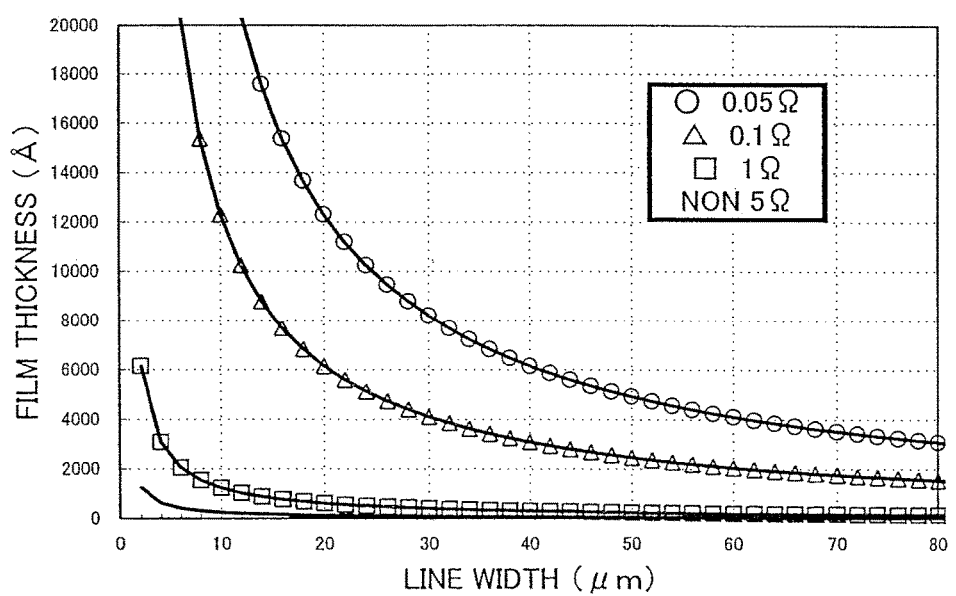
FIG. 11 is a graph showing a calculation result of the invention.
Figure 12:
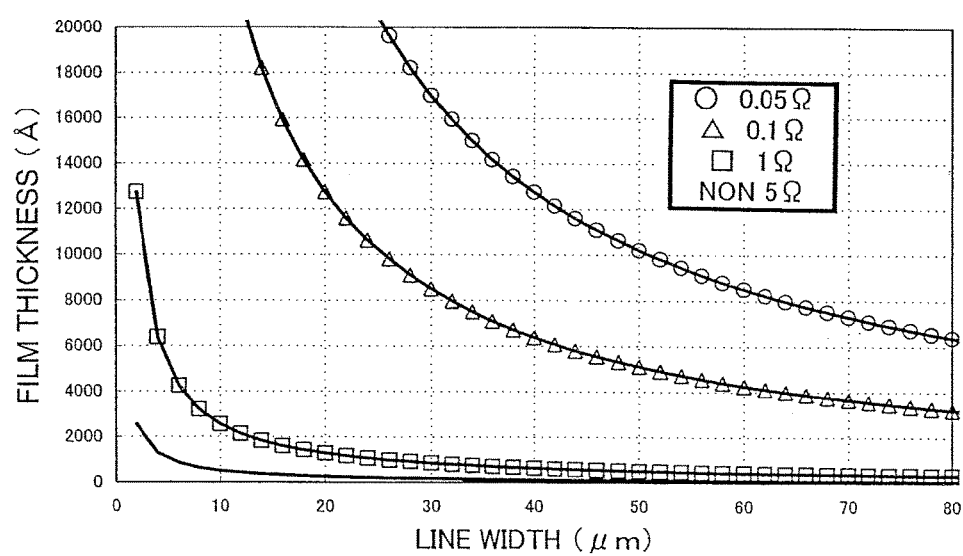
FIG. 12 is a graph showing a calculation result of the invention.

In this embodiment, Al—Si and Al—Ti are used for a material of an auxiliary wiring. When the line width of the auxiliary wiring of one length is changed in the range of 2 μm to 82 μm, a film thickness necessary for obtaining resistance value of 0.01Ω, 0.1Ω, 1Ω, and 5Ω is calculated. The result used Al—Si is shown in FIG. 11 and the result used Al—Ti is shown in FIG. 12.

Using the computation expression: $R = R_{real} \times (d_s/d) \times (W_s/W)$, R represents resistance value that can be obtained by changing the width of the auxiliary wiring and the film thickness, where W: a real width of the auxiliary wiring, d: a real film thickness of the auxiliary wiring, $W_s$: a width of the auxiliary wiring in designing, $d_s$: a film thickness of the auxiliary wiring in designing, and $R_{real}$: a real resistivity in each material. Real resistivity of Al—Si and Al—Ti: $R_{real}$ is $4.1 \times 10^{-6}$ Ω·cm, $8.5 \times 10^{-6}$ Ω·cm, respectively.

Desired resistance value of the auxiliary wiring is changed due to the panel size of the display device. The larger the panel size becomes, the lower resistance value of the auxiliary wiring is required since the wiring becomes long. Here, the resistance value of 0.1Ω is discussed. According to FIGS. 11 and 12, it can be understood that the auxiliary wiring needs to have the width of about 30 μm and the film thickness of 4000 Å (400 nm) when Al—Si is used, and the width of about 60 μm and the film thickness of 4000 Å (400 nm) when Al—Ti is used in order to obtain the resistance value of 0.1Ω.

Although there is a limitation on the width and the film thickness of the auxiliary wiring, the film thickness of 4000 Å (400 nm) is a value that can be realized. In addition, in the case of the bottom emission type display device, it is not desirable that the width of the auxiliary wiring exceeds the insulating film corresponding to a bank, considering the aperture ratio. Therefore, when the auxiliary wiring is required to have a width of the bank, the auxiliary wiring may be laminated.

Furthermore, when the auxiliary wiring is formed as a top emission type display device in a layer different from that of an anode as shown in FIG. 1B, the limit of the width of the auxiliary wiring is not required to have the width of the bank. Consequently, much lower sheet resistance can be obtained.

Substantial resistance can be reduced by connecting the auxiliary wiring to the electrode or the wiring of the display device. Consequently, reduction in the power consumption of the display device can be achieved.

In addition, a signal writing defect, a gradation defect, and the like due to a wiring resistance can be prevented. Furthermore, the generation of voltage drop can be controlled so that it becomes possible to apply uniform amount of voltage to a light-emitting element. Consequently, the improvement of the display quality can be obtained.

Especially in a large display device, an advantageous effect of reducing the substantial resistance of an electrode and a wiring is remarkable.

What is claimed is:

1. A display device comprising:
   a semiconductor film;
   a first insulating film on and in contact with the semiconductor film;
   a gate on and in contact with the first insulating film and overlapping with the semiconductor film;
   a second insulating film on and in contact with the gate;
   a third insulating film over the second insulating film;
   a second conductive film and a third conductive film each on and in contact with the third insulating film and electrically connected to the semiconductor film;
   a fourth insulating film on and in contact with the second conductive film and the third conductive film;
   a fourth conductive film and a fifth conductive film each on and in contact with the fourth insulating film;
   a fifth insulating film over the fourth conductive film and the fifth conductive film, the fifth insulating film comprising an opening overlapping with the fifth conductive film;
   a light-emitting layer over the fifth insulating film and in contact with the fifth conductive film at the opening of the fifth insulating film; and
   a sixth conductive film over the light-emitting layer and the fifth insulating film,
   wherein the semiconductor film comprises a portion overlapping with the gate,
   wherein the portion of the semiconductor film meanders,
   wherein the third conductive film is a power supply line, and
   wherein the power supply line overlaps the portion of the semiconductor film.

2. The display device according to claim 1, wherein the sixth conductive film is on and in contact with the fourth conductive film.

3. The display device according to claim 1, wherein the fourth conductive film and the sixth conductive film are electrically connected to each other.

4. The display device according to claim 1, wherein the fourth conductive film functions as an auxiliary wiring of the sixth conductive film.

5. The display device according to claim 1, wherein the semiconductor film is over a substrate.

6. The display device according to claim 1, wherein the fourth insulating film comprises an inorganic material.

7. A display device comprising:
   a semiconductor film;
   a first insulating film on and in contact with the semiconductor film;
   a gate on and in contact with the first insulating film and overlapping with the semiconductor film;
   a second insulating film on and in contact with the gate;
   a third insulating film on and in contact with the second insulating film;
   a second conductive film and a third conductive film each on and in contact with the third insulating film and electrically connected to the semiconductor film;
   a fourth insulating film on and in contact with the second conductive film and the third conductive film;
   a fourth conductive film and a fifth conductive film each on and in contact with the fourth insulating film;
   a fifth insulating film on and in contact with the fourth conductive film and the fifth conductive film, the fifth insulating film comprising an opening overlapping with the fifth conductive film;
   a light-emitting layer on and in contact with the fifth insulating film and in contact with the fifth conductive film at the opening of the fifth insulating film; and
   a sixth conductive film on and in contact with the light-emitting layer and the fifth insulating film,
   wherein the semiconductor film comprises a portion overlapping with the gate,
   wherein the portion of the semiconductor film meanders,
   wherein the third conductive film is a power supply line, and
   wherein the power supply line overlaps the portion of the semiconductor film.

8. The display device according to claim 7, wherein the sixth conductive film is on and in contact with the fourth conductive film.

9. The display device according to claim 7, wherein the fourth conductive film and the sixth conductive film are electrically connected to each other.

10. The display device according to claim 7, wherein the fourth conductive film functions as an auxiliary wiring of the sixth conductive film.

11. The display device according to claim 7, wherein the semiconductor film is over a substrate.

12. The display device according to claim 7, wherein the fourth insulating film comprises an inorganic material.

13. A display device comprising:
    a semiconductor film;
    a first insulating film on and in contact with the semiconductor film;
    a gate on and in contact with the first insulating film and overlapping with the semiconductor film;
    a second insulating film on and in contact with the gate;
    a third insulating film over the second insulating film;
    a second conductive film and a third conductive film each on and in contact with the third insulating film and electrically connected to the semiconductor film;
    a fourth insulating film on and in contact with the second conductive film and the third conductive film;
    a fourth conductive film and a fifth conductive film each on and in contact with the fourth insulating film;
    a fifth insulating film over the fourth conductive film and the fifth conductive film, the fifth insulating film comprising an opening overlapping with the fifth conductive film;
    a light-emitting layer over the fifth insulating film and in contact with the fifth conductive film at the opening of the fifth insulating film; and a sixth conductive film over the light-emitting layer and the fifth insulating film, wherein the semiconductor film comprises a portion overlapping with the gate, wherein the portion of the semiconductor film bends, wherein the third conductive film is a power supply line, and wherein the power supply line overlaps the portion of the semiconductor film.

14. The display device according to claim 13, wherein the sixth conductive film is on and in contact with the fourth conductive film.

15. The display device according to claim 13, wherein the fourth conductive film and the sixth conductive film are electrically connected to each other.

16. The display device according to claim 13, wherein the fourth conductive film functions as an auxiliary wiring of the sixth conductive film.

17. The display device according to claim 13, wherein the semiconductor film is over a substrate.

18. The display device according to claim 13, wherein the fourth insulating film comprises an inorganic material.

19. A display device comprising:
a semiconductor film;
a first insulating film on and in contact with the semiconductor film;
a gate on and in contact with the first insulating film and overlapping with the semiconductor film;
a second insulating film on and in contact with the gate;
a third insulating film on and in contact with the second insulating film;
a second conductive film and a third conductive film each on and in contact with the third insulating film and electrically connected to the semiconductor film;
a fourth insulating film on and in contact with the second conductive film and the third conductive film;
a fourth conductive film and a fifth conductive film each on and in contact with the fourth insulating film;
a fifth insulating film on and in contact with the fourth conductive film and the fifth conductive film, the fifth insulating film comprising an opening overlapping with the fifth conductive film;
a light-emitting layer on and in contact with the fifth insulating film and in contact with the fifth conductive film at the opening of the fifth insulating film; and
a sixth conductive film on and in contact with the light-emitting layer and the fifth insulating film, wherein the semiconductor film comprises a portion overlapping with the gate, wherein the portion of the semiconductor film bends, wherein the third conductive film is a power supply line, and wherein the power supply line overlaps the portion of the semiconductor film.

20. The display device according to claim 19, wherein the sixth conductive film is on and in contact with the fourth conductive film.

21. The display device according to claim 19, wherein the fourth conductive film and the sixth conductive film are electrically connected to each other.

22. The display device according to claim 19, wherein the fourth conductive film functions as an auxiliary wiring of the sixth conductive film.

23. The display device according to claim 19, wherein the semiconductor film is over a substrate.

24. The display device according to claim 19, wherein the fourth insulating film comprises an inorganic material.

* * * * *